United States Patent
Lee et al.

(10) Patent No.: US 7,635,645 B2
(45) Date of Patent: Dec. 22, 2009

(54) METHOD FOR FORMING INTERCONNECTION LINE IN SEMICONDUCTOR DEVICE AND INTERCONNECTION LINE STRUCTURE

(75) Inventors: Kyoung-Woo Lee, Seoul (KR); Hong-Jae Shin, Seoul (KR); Jae-Hak Kim, Seoul (KR); Young-Jin Wee, Seongnam-si (KR); Seung-Jin Lee, Suwon-si (KR); Ki-Kwan Park, Busan-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 252 days.

(21) Appl. No.: 11/028,515

(22) Filed: Jan. 4, 2005

(65) Prior Publication Data
US 2005/0161821 A1 Jul. 28, 2005

(30) Foreign Application Priority Data
Jan. 28, 2004 (KR) .................. 10-2004-0005520

(51) Int. Cl.
*H01L 21/4763* (2006.01)
(52) U.S. Cl. .................. 438/637; 438/640; 438/700; 438/738; 257/E21.579
(58) Field of Classification Search ......... 438/622–624, 438/633, 637–640, 700–702, 738, 740; 257/E21.579
See application file for complete search history.

(56) References Cited

U.S. PATENT DOCUMENTS

| | | |
|---|---|---|
| 4,789,648 A | 12/1988 | Chow et al. |
| 4,944,836 A | 7/1990 | Beyer et al. |
| 6,057,239 A | 5/2000 | Wang et al. |
| 6,479,391 B2* | 11/2002 | Morrow et al. ............. 438/706 |
| 6,509,267 B1 | 1/2003 | Woo et al. |
| 6,566,283 B1 | 5/2003 | Pangrle et al. |
| 6,767,827 B1* | 7/2004 | Okada et al. ................ 438/638 |
| 7,129,162 B2* | 10/2006 | Hong et al. ................. 438/637 |
| 2003/0001273 A1 | 1/2003 | Steiner et al. |
| 2003/0114000 A1* | 6/2003 | Noguchi ..................... 438/687 |
| 2003/0134505 A1 | 7/2003 | Dalton et al. |
| 2003/0183940 A1* | 10/2003 | Noguchi et al. ............ 257/767 |
| 2003/0227086 A1 | 12/2003 | Otsuka et al. |

FOREIGN PATENT DOCUMENTS

| | | |
|---|---|---|
| KR | 1020010098409 A | 11/2001 |
| KR | 1020020085722 A | 11/2002 |
| KR | 1020030038736 A | 5/2003 |
| KR | 1020030068478 A | 8/2003 |
| WO | WO 02/23625 A2 | 3/2002 |

* cited by examiner

*Primary Examiner*—Thanhha Pham
(74) *Attorney, Agent, or Firm*—Volentine & Whitt, PLLC (57) ABSTRACT

Methods for forming an interconnection line and interconnection line structures are disclosed. The method includes forming an interlayer insulating layer on a semiconductor substrate, wherein the interlayer insulating layer is formed of a carbon-doped low-k dielectric layer. An oxidation barrier layer is formed on the interlayer insulating layer. An oxide capping layer is formed on the oxidation barrier layer. A via hole is in the oxide capping layer, the oxidation barrier, and the interlayer insulating layer. A conductive layer pattern is formed within the via hole.

6 Claims, 15 Drawing Sheets

METHOD FOR FORMING INTERCONNECTION LINE IN SEMICONDUCTOR DEVICE AND INTERCONNECTION LINE STRUCTURE

BACKGROUND OF THE INVENTION

1. Field of the Invention

The present invention generally relates to a method for fabricating a semiconductor device. More particularly, the present invention generally relates to a method for forming an interconnection line in a semiconductor device and an interconnection line structure.

A claim is made to Korean Patent Application No. 2004-5520, filed Jan. 28, 2004, the contents of which are hereby incorporated by reference.

2. Description of the Related Art

As the design rule for semiconductor devices has gotten smaller, the density of interconnection lines to interconnect and drive components has increased, and the width of interconnection lines has decreased. As a result, parasitic capacitance has increased due to the reduction in space between interconnection lines. In addition, interconnection line resistance has increased due to the reduction in the cross sectional area of the interconnection line. Increase in the interconnection line resistance and the parasitic capacitance cause Resistance-Capacitance delay (RC delay), which slow electrical signals throughout a circuit. The RC delay slows the total operational speed of the semiconductor device and increases power consumption. The RC delay must be overcome in order to implement highly integrated semiconductor devices.

Interconnection line resistance is reduced by employing a conductive material having low specific resistance; copper is a suitable interconnection line material in a damascene process. The damascene process is classified into a single damascene process and a dual damascene process. A conventional single damascene process is disclosed in U.S. Pat. No. 4,944,836, and a conventional dual damascene process is disclosed in U.S. Pat. No. 4,789,648. U.S. Pat. No. 6,057,239 discloses a conventional dual damascene process using a sacrificial filling layer.

To reduce the parasitic capacitance, an interlayer insulating layer or an inter-metallic insulating layer formed from a low-k dielectric material such as an organo silicate glass (OSG) is employed to isolate the interconnection lines. However, low-k dielectric materials have poor mechanical and chemical properties as compared to silicon oxide. As a result, when an interconnection line is formed with a low-k dielectric material interlayer insulating layer or an inter-metallic insulating layer is used, the low-k dielectric layer deteriorates during a subsequent plasma type dry etching or planarization process. Thus, in order to prevent the low-k dielectric layer from deteriorating, an oxide capping layer is formed on the low-k dielectric layer.

However, carbon within the low-k dielectric layer reacts with oxygen during the plasma process. Oxygen is used as an oxidizing agent when forming the oxide capping layer. Oxidation of the low-k dielectric layer creates porous properties on the surface of the layer. As a result, a serious under cutting of the low-k dielectric layer occurs during a wet cleaning process. The wet cleaning process is used after a trench or via hole is formed within the low-k dielectric layer by patterning an oxide capping layer and the low-k dielectric layer. Moreover, if the dielectric constant of the low-k dielectric layer is changed, the reliability of the semiconductor device is degraded.

SUMMARY OF THE INVENTION

Embodiments of the present invention provide methods for forming an interconnection line of a semiconductor device. Embodiments of the present invention also provide an interconnection line structure of a semiconductor device.

Accordingly, the present invention discloses a method for forming an interconnection line of a semiconductor device by providing forming an interlayer insulating layer on a semiconductor substrate, the interlayer insulating layer being formed of a low-k carbon-doped dielectric material, forming an oxidation barrier layer on the interlayer insulating layer, forming an oxide capping layer on the oxidation barrier layer, forming a via hole through the oxide capping layer, the oxidation barrier, and the interlayer insulating layer, and forming a conductive layer pattern within the via hole.

Another embodiment discloses a method for forming an interconnection line of a semiconductor device by forming an interlayer insulating layer on a semiconductor substrate, the interlayer insulating layer being formed of a low-k carbon-doped dielectric material, forming an oxidation barrier layer on the interlayer insulating layer, forming an oxide capping layer on the oxidation barrier layer, forming a dual damascene pattern in the oxide capping layer, the oxidation barrier layer, and the interlayer insulating layer, and forming a conductive pattern within the dual damascene pattern.

The present invention also discloses an interconnection line structure including a semiconductor substrate, a low-k carbon-doped dielectric layer disposed on the semiconductor substrate, an oxidation barrier layer disposed on the low-k carbon-doped dielectric layer, an opening in the oxidation barrier layer and the low-k carbon-doped dielectric layer, and a conductive layer pattern filled in the opening.

BRIEF DESCRIPTION OF THE DRAWINGS

Aspects of the invention will be apparent from the following description of preferred embodiments, and the illustrated drawings.

DETAILED DESCRIPTION OF THE INVENTION

The present invention will now be described more fully hereinafter with reference to the accompanying drawings, in which exemplary embodiments of the invention are shown. In the drawings, the thickness of the layers and regions are exaggerated for clarity. It will be understood that when an element such as a layer, a region or a substrate is referred to as being "on" or "onto" another element, it can be directly on the other element or intervening elements may also be present.

FIG. 1 to FIG. 4 are cross-sectional views illustrating a method for forming an interconnection line of a semiconductor device in accordance with a first embodiment of the present invention.

Figure 1:
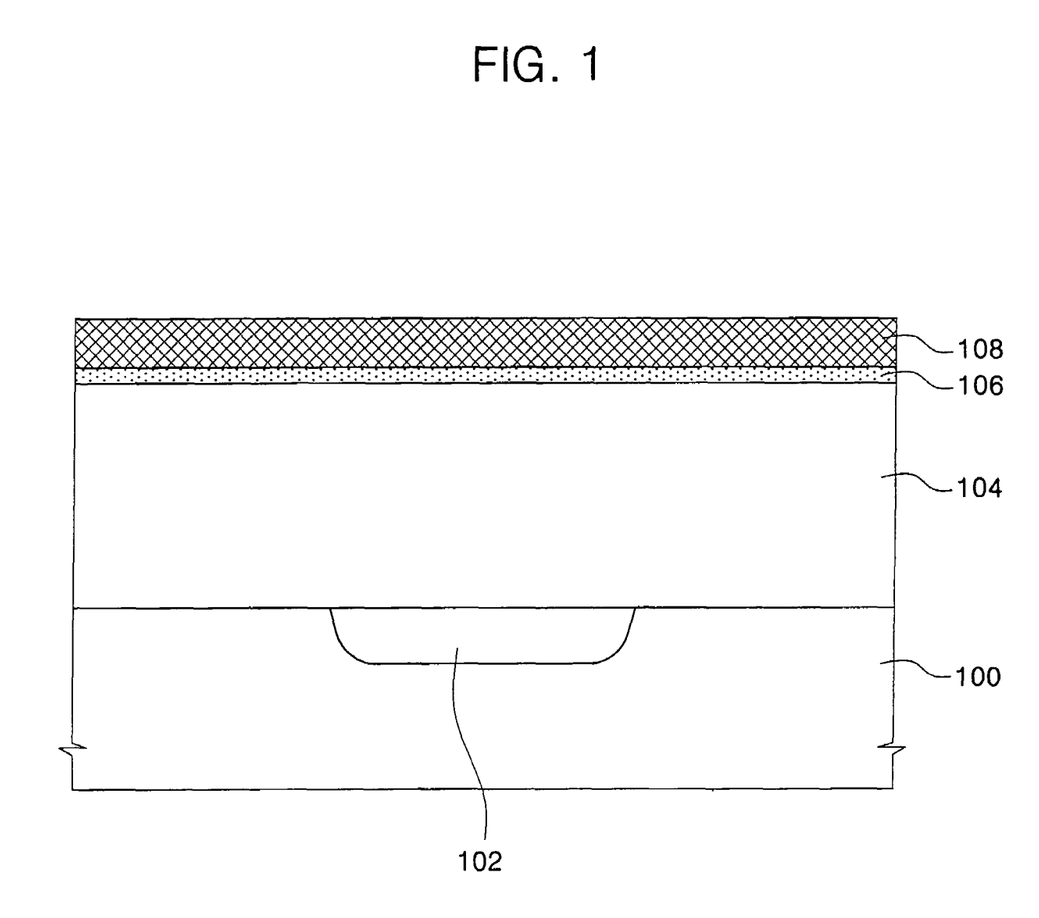
FIG. 1 to FIG. 4 are cross-sectional view illustrating a method for forming an interconnection line of a semiconductor device in accordance with a first embodiment of the present invention.

Referring to FIG. 1, an interlayer insulating layer 104 is formed on a semiconductor substrate 100. A conductive region 102 is formed in semiconductor substrate 100. Conductive region 102 is preferably an impurity diffusion region having P type or N type impurity ions implanted therein. Interlayer insulating layer 104 is formed of a low-k carbon-doped dielectric material. In the embodiments of the present invention, the low-k dielectric material has a dielectric constant lower than silicon oxide, which has a dielectric constant of about 4. Interlayer insulating layer 104 is preferably formed of an OSG layer of SiOC or SiOCH. For example, the low-k carbon-doped dielectric layer is an organic spin-on polymer layer such as SiLK™, which is available from Dow Chemical Co. When interlayer insulating layer 104 is formed from an OSG layer, the OSG layer is preferably formed by a plasma enhanced CVD (PECVD) process. In this case, CORAL™ by Novellus, Black Diamond™ by Applied Materials, Inc., Sumika Film™ by Sumitomo Chemical America, Inc., or AURORA™ of ASM International may be used as a precursor.

An oxidation barrier layer 106 is formed on interlayer insulating layer 104. Oxidation barrier layer 106 is preferably a silicon carbide nitride (SiCN) layer. The SiCN layer is preferably formed by a PECVD process. In this case, methyl silane, dimethyl silane, trimethyl silane, or tetramethyl silane may be used as silicon and carbon sources, and $NH_3$ and He gas may be used as reaction gases. Oxidation barrier layer 106 is formed to a thickness of about 100 Å or less, preferably about 50 Å or less.

Next, an oxide capping layer 108 is formed on oxidation barrier 106. Oxide capping layer 108 prevents interlayer insulating layer 104 from deteriorating during a subsequent dry etching process. Oxide capping layer 108 is preferably formed, for example, of an undoped silicate glass (USG), a fluorinated silicate glass (FSG), or a tetra ethyl ortho silicate (TEOS) by a PECVD process. Reactive oxygen from the plasma reaction used during the formation of oxide capping layer 108 may oxidize the upper portion of interlayer insulating layer 104. However, oxidation barrier 106 interposed between interlayer insulating layer 104 and oxide capping layer 108 prevents the oxidation of the upper portion of interlayer insulating layer 104.

Figure 2:
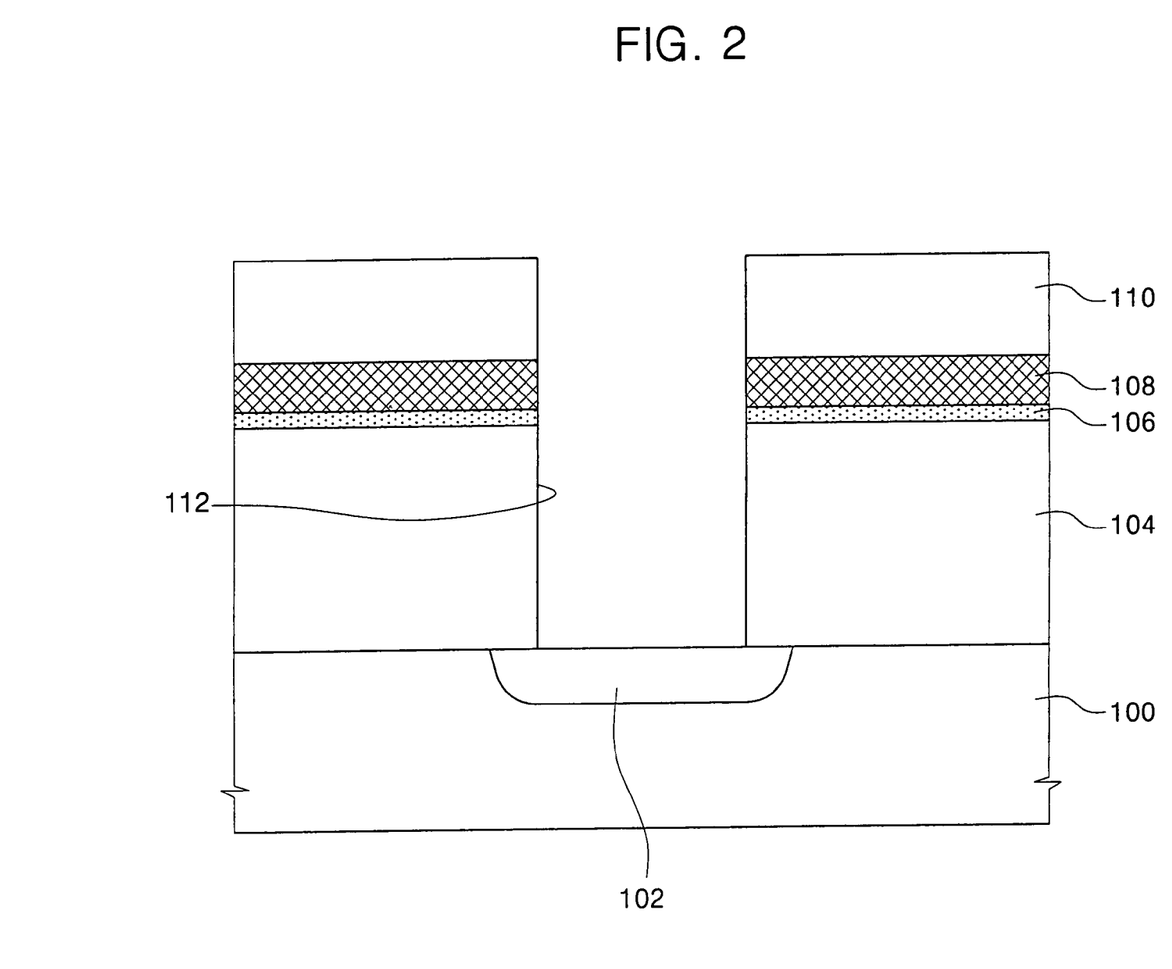

Referring to FIG. 2, a photoresist pattern 110 is formed on oxide capping layer 108 to expose a predetermined region of oxide capping layer 108. Oxide capping layer 108, oxidation barrier 106, and interlayer insulating layer 104 are patterned using photoresist pattern 110 as an etch mask. The patterning is preferably carried out by a plasma anisotropic etching process. As a result, a via hole 112 is formed to expose conductive region 102. If necessary, an etch-stop layer (not shown) may be formed between semiconductor substrate 100 and interlayer insulating layer 104 to prevent damage to the upper portion of conductive region 102 during the anisotropic etching process. The etch-stop layer on conductive region 102 may be etched during the anisotropic etching process or by an additional wet etching process.

Figure 3:
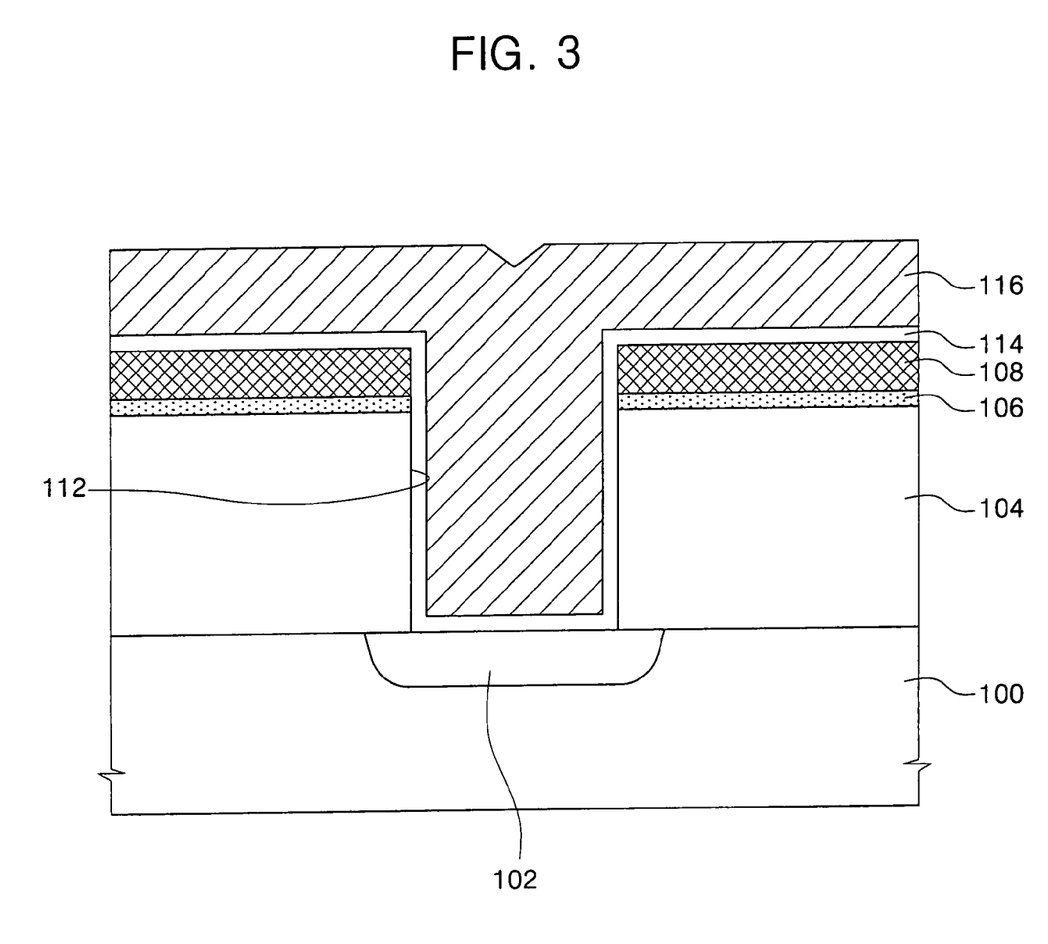

Referring to FIG. 3, photoresist pattern 110 is removed by an ashing process. A wet cleaning is then carried out to remove any etch byproducts from the anisotropic etching process, or to remove any oxidation layer formed on conductive region 102. The wet cleaning process is preferably carried out using a fluorine-based etchant such as dilute HF (DHF). Oxidation barrier layer 106 prevents undercutting on the upper portion of interlayer insulating layer 104 during the wet cleaning process.

After the wet cleaning process, a conductive layer 116 is formed to completely fill via hole 112. Conductive layer 116 is preferably copper. Alternatively, conductive layer 116 may be a metal layer such as Al and W, or conductive layer 116 may be a polysilicon layer. If necessary, a diffusion barrier layer 114 may be formed on oxide capping layer 108, conductive region 102, and the side-walls of via hole 112 to prevent diffusion or reaction between interlayer insulating layer 104 and conductive layer 116. Diffusion barrier layer 114 is formed of at least a single stacked layer of Ta, TaN, TaAlN, TaSiN, $TaSi_2$, Ti, TiN, WN, and TiSiN.

Figure 4:
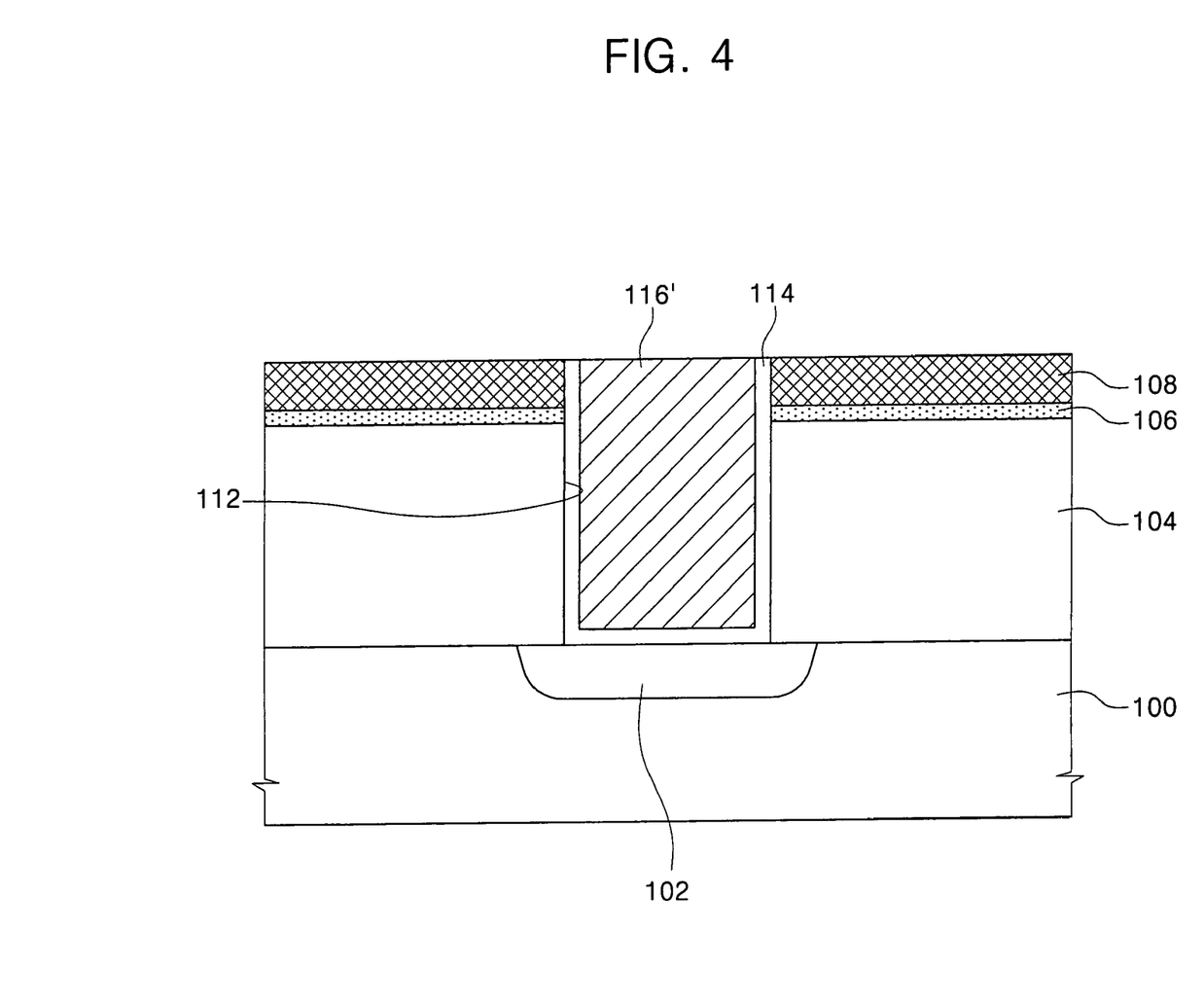

Referring to FIG. 4, conductive layer 116 is planarized to form a conductive layer pattern 116' filling via hole 112. For example, conductive layer 116 is preferably chemically and mechanically polished to expose oxide capping layer 108. If diffusion barrier layer 114 is formed, portions thereof formed on oxide capping layer 108 are removed. In this case, oxide capping layer 108 prevents interlayer insulating layer 104 from being exposed to the polishing process. Alternatively, the chemically and mechanically polishing process may also be carried out until conductive layer 116, oxide capping layer 108, and oxidation barrier layer 106 are polished away, thereby exposing interlayer insulating layer 104. Parasitic capacitance due to oxide capping layer 108 and oxidation barrier layer 106 may be prevented.

Hereinafter, an interconnection line structure of the semiconductor device will be described with reference to FIG. 4 in accordance with the first embodiment of the present invention.

The interconnection line structure comprises a semiconductor substrate 100, and an interlayer insulating layer 104 disposed on semiconductor substrate 100. Interlayer insulating layer 104 is formed of a low-k carbon-doped dielectric layer. An etch-stop layer (not shown) may be preferably interposed between semiconductor substrate 100 and interlayer insulating layer 104. An oxidation barrier layer 106 is disposed on interlayer insulating layer 104. Oxidation barrier layer 106 is preferably formed of SiCN. Furthermore, oxidation barrier layer 106 is about 100 Å or less, more preferably, the thickness is about 50 Å or less. Oxidation barrier layer 106 prevents the upper portion of interlayer insulating layer 104 from being oxidized. In addition, an oxide capping layer 108 is preferably further disposed on oxidation barrier layer 106 in accordance with the first embodiment of the present invention. A conductive layer pattern 116' is formed within the via hole by filling via hole 112. Via hole 112 passes through oxide capping layer 108, oxidation barrier layer 106, and interlayer insulating layer 104. If necessary, a diffusion barrier layer 114 may be further interposed between conductive layer pattern 116' and an inner wall of via hole 112.

FIG. 5 to FIG. 11 are cross-sectional views illustrating a method for forming an interconnection line of a semiconductor device in accordance with a second embodiment of the present invention.

Figure 5:
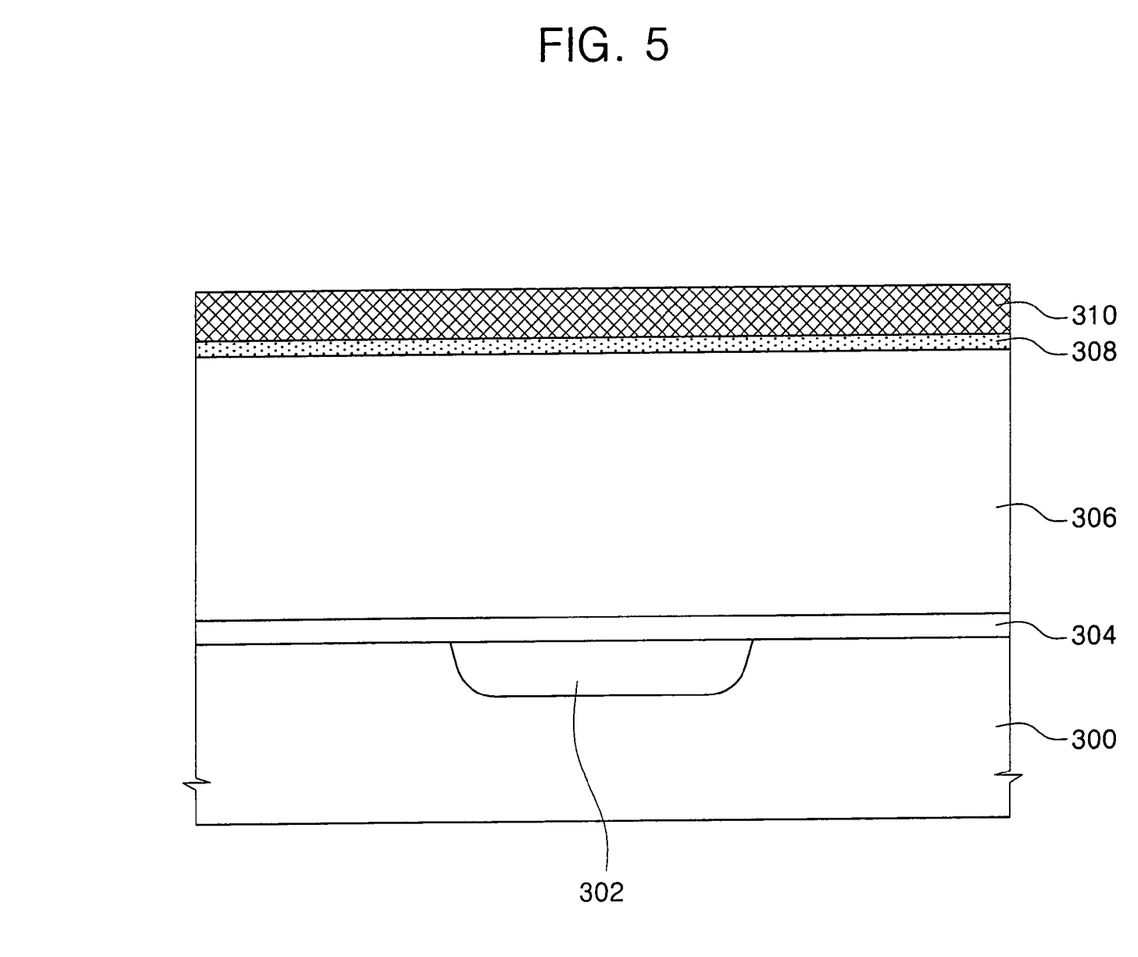
FIG. 5 to FIG. 11 are cross-sectional view illustrating a method for forming an interconnection line of a semiconductor device in accordance with a second embodiment of the present invention.

Referring to FIG. 5, an etch-stop layer 304 is formed on a semiconductor substrate 300. A conductive region 302 is formed in semiconductor substrate 300. Conductive region 302 is preferably an impurity diffusion region formed by implanting P type or N type impurity ions into semiconductor substrate 300. Etch-stop layer 304 is preferably formed of SiN, SIC, or SiCN. Etch-stop layer 304 prevents conductive region 302 from being exposed and damaged in a subsequent wet cleaning process or a subsequent anisotropic etching process to form a via hole. The same methods and materials may be applied as in the first embodiment to successively form an interlayer insulating layer 306 of low-k carbon-doped dielectric material, oxidation barrier layer 308, and oxide capping layer 310. Oxidation barrier layer 308 is preferably formed of a SiCN layer having a thickness of about 100 Å or less; and preferably, the thickness is of about 50 Å or less.

Next, a dual damascene pattern is formed in oxide capping layer 310, oxidation barrier layer 308, and interlayer insulating layer 306 to expose etch-stop layer 304.

Figure 6:
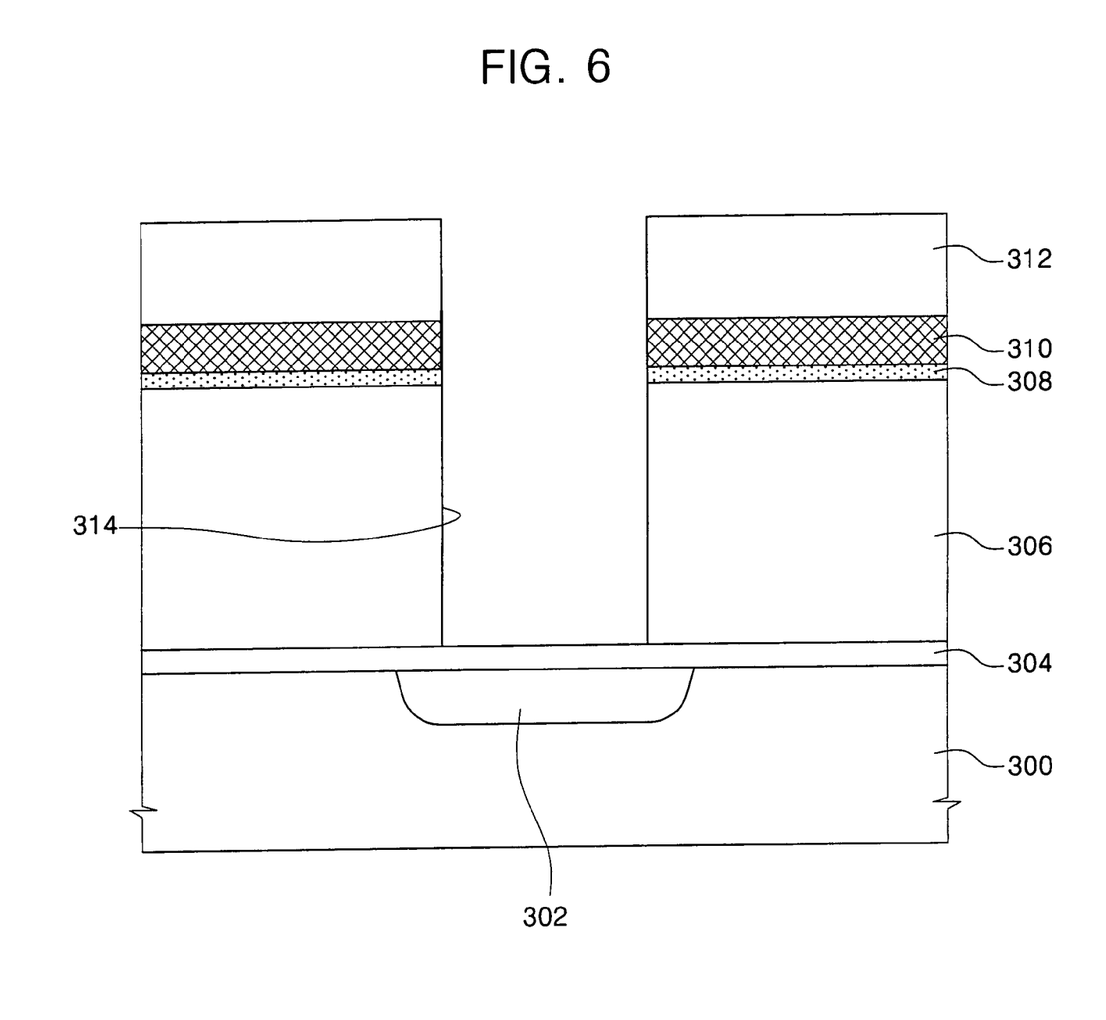

Referring to FIG. 6, a first photoresist pattern 312 to expose a predetermined region of oxide capping layer 310 is formed on oxide capping layer 310. Oxide capping layer 310, oxidation barrier 308, and interlayer insulating layer 306 are anisotropically etched using first photoresist pattern 312 as an etch mask to form a via hole 314 to expose etch-stop layer 304.

Figure 7:
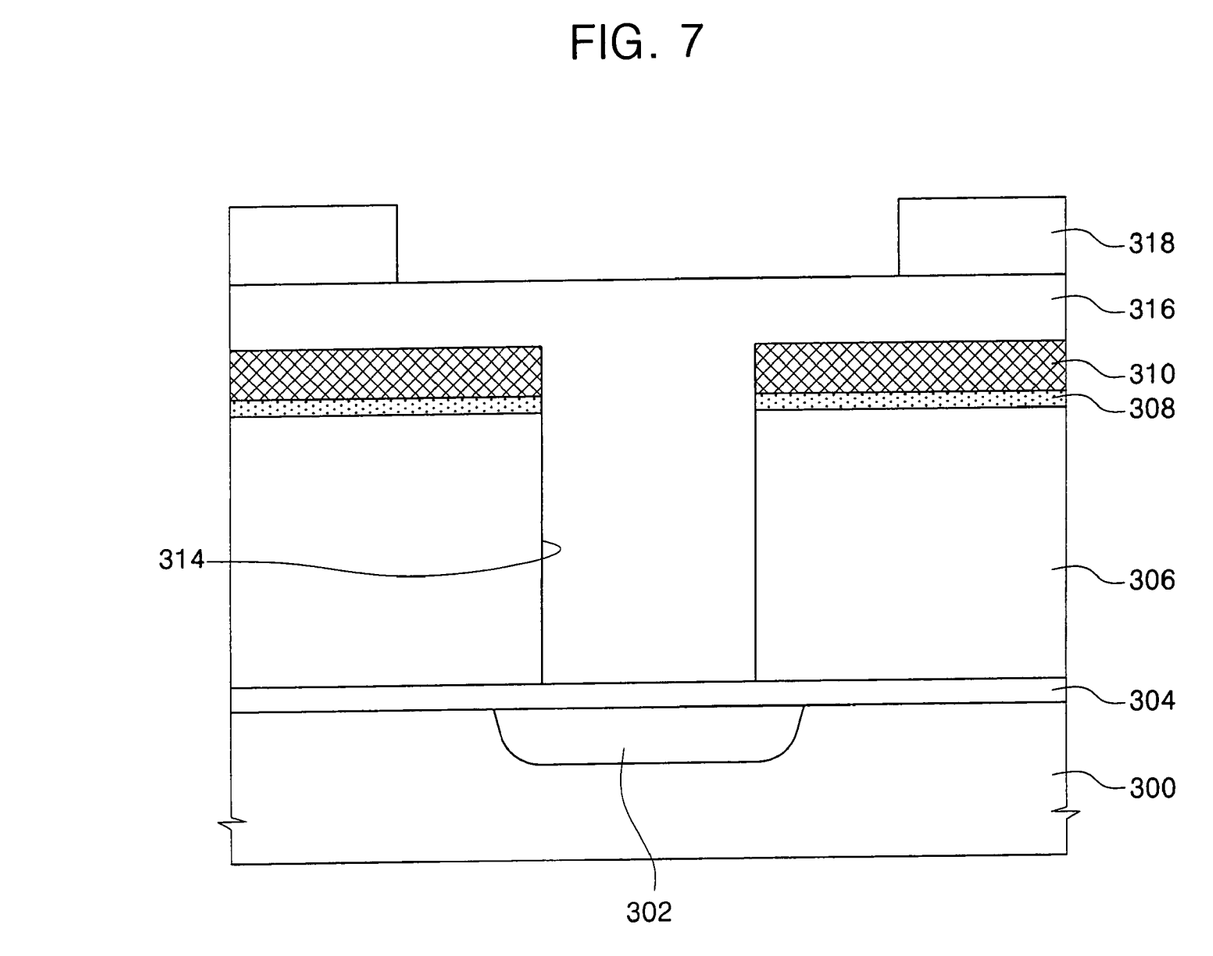

Referring to FIG. 7, first photoresist pattern 312 is removed by an ashing process. A sacrificial filling layer 316 is provided to completely fill via hole 314. A second photoresist pattern 318 is then formed on sacrificial filling layer 316. Sacrificial filling layer 316 prevents conductive region 302 from being exposed during a subsequent anisotropic etching process to form a trench. Sacrificial filling layer 316 is a hydro silses quioxane (HSQ), formed by a spin-on process.

Figure 8:
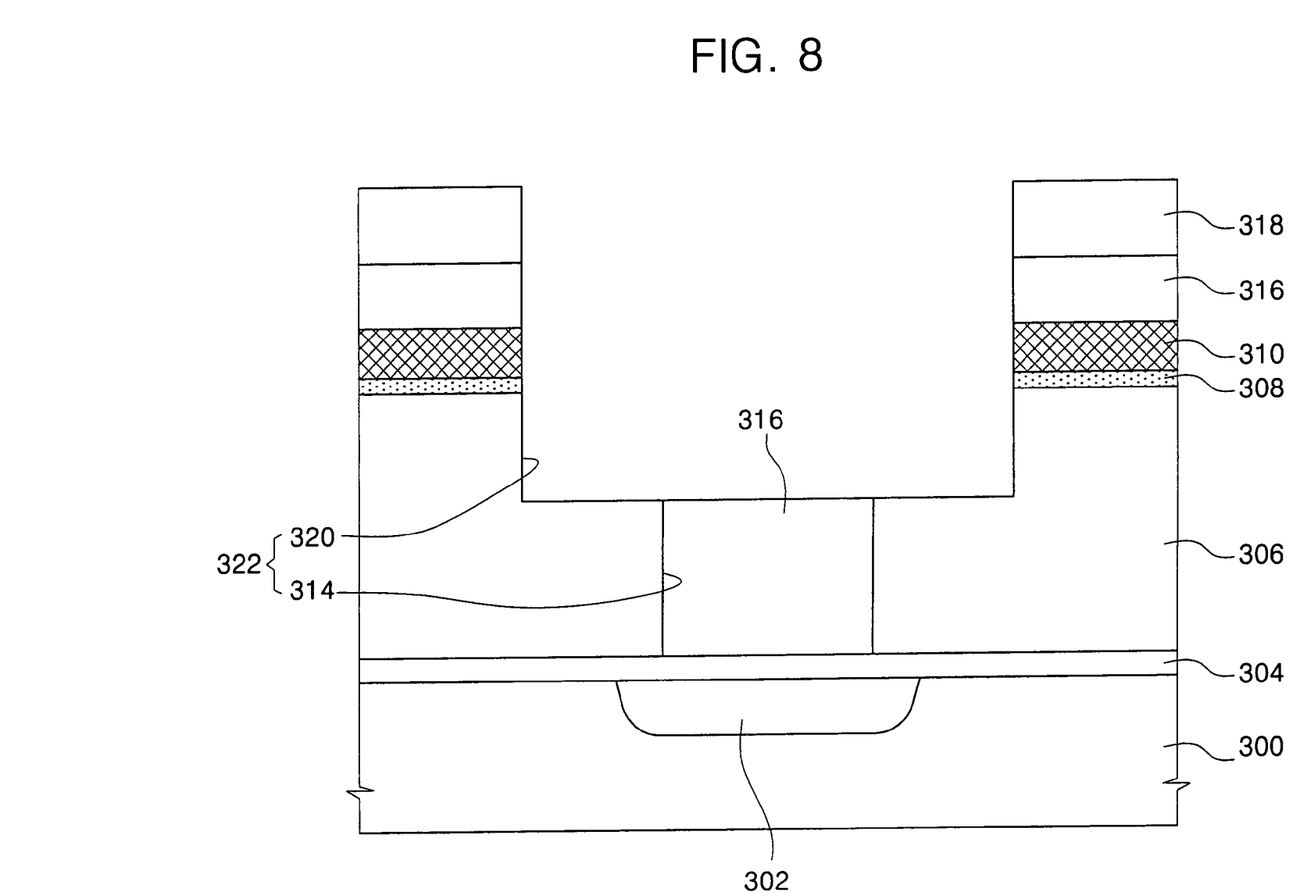

Referring to FIG. 8, using second photoresist pattern 318 as an etch mask, sacrificial filling layer 316, oxide capping layer 310, oxidation barrier layer 308, and portion of interlayer insulating layer 306 are anisotropically etched to form a trench 320. As a result, a dual damascene pattern 322 comprising via hole 314 and trench 320 is formed.

Figure 9:
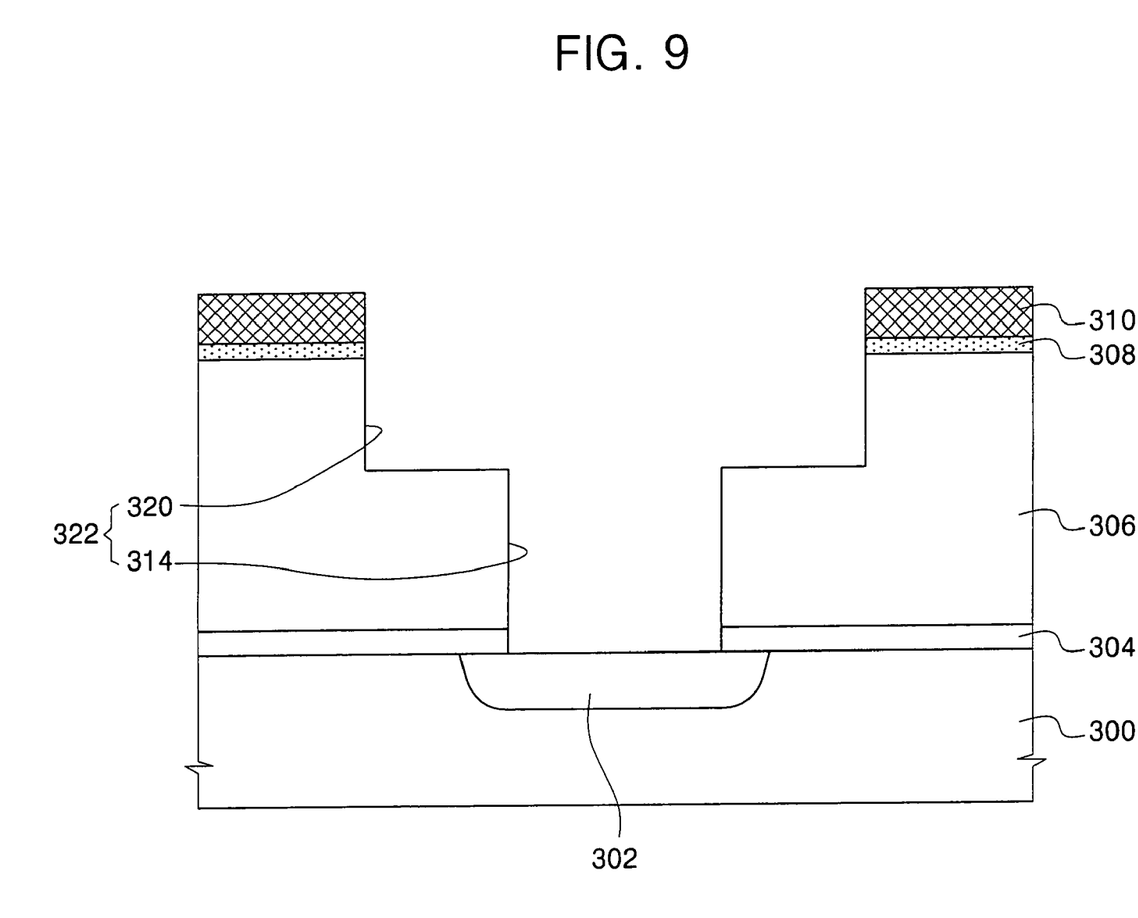

Referring to FIG. 9, second photoresist pattern 318 is removed by an additional ashing process. Any sacrificial filling layer 316 remaining on interlayer insulating layer 306 and via hole 314 is then removed. If sacrificial filling layer 316 is HSQ, any remaining layer is preferably removed by a wet etching process using an etchant containing HF. Etch-stop layer 304 exposed by dual damascene pattern 322 is then removed to expose conductive region 302. If etch-stop layer 304 is silicon nitride, it is preferably removed by a wet etching process using an etchant containing phosphoric acid.

Within the foregoing embodiment(s), several wet etching or wet Cleaning processes are carried out. These processes, for example, are performed to remove any etch byproducts after the formation of via hole 314 and trench 320, or to remove any HSQ used as sacrificial filling layer 316. In addition, additional wet cleaning processes are carried out to remove oxidation layer formed on conductive region 302 exposed by dual damascene pattern 322.

Figure 10:
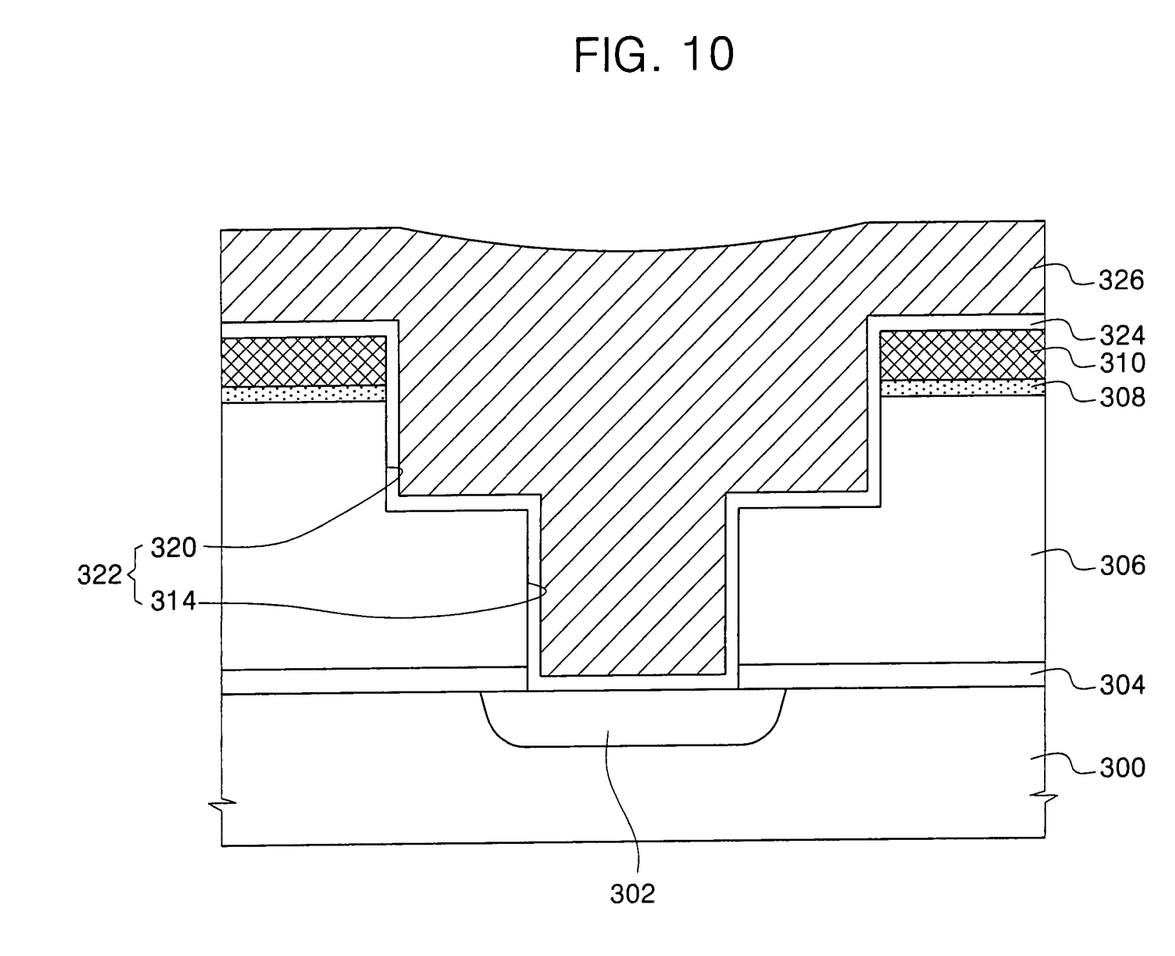

Referring to FIG. 10, a conductive layer 326 is formed to completely fill dual damascene pattern 322. Conductive layer 326 is preferably copper. A diffusion barrier layer 324 may optionally be formed on oxide capping layer 310, exposed conductive region 302, and inner walls of dual damascene pattern 322 prior to the formation of conductive layer 326. Diffusion barrier layer 324 is preferably formed of at least one stacked layer of Ta, TaN, TaAlN, TaSiN, TaSi$_2$, Ti, TiN, WN, and TiSiN.

Figure 11:
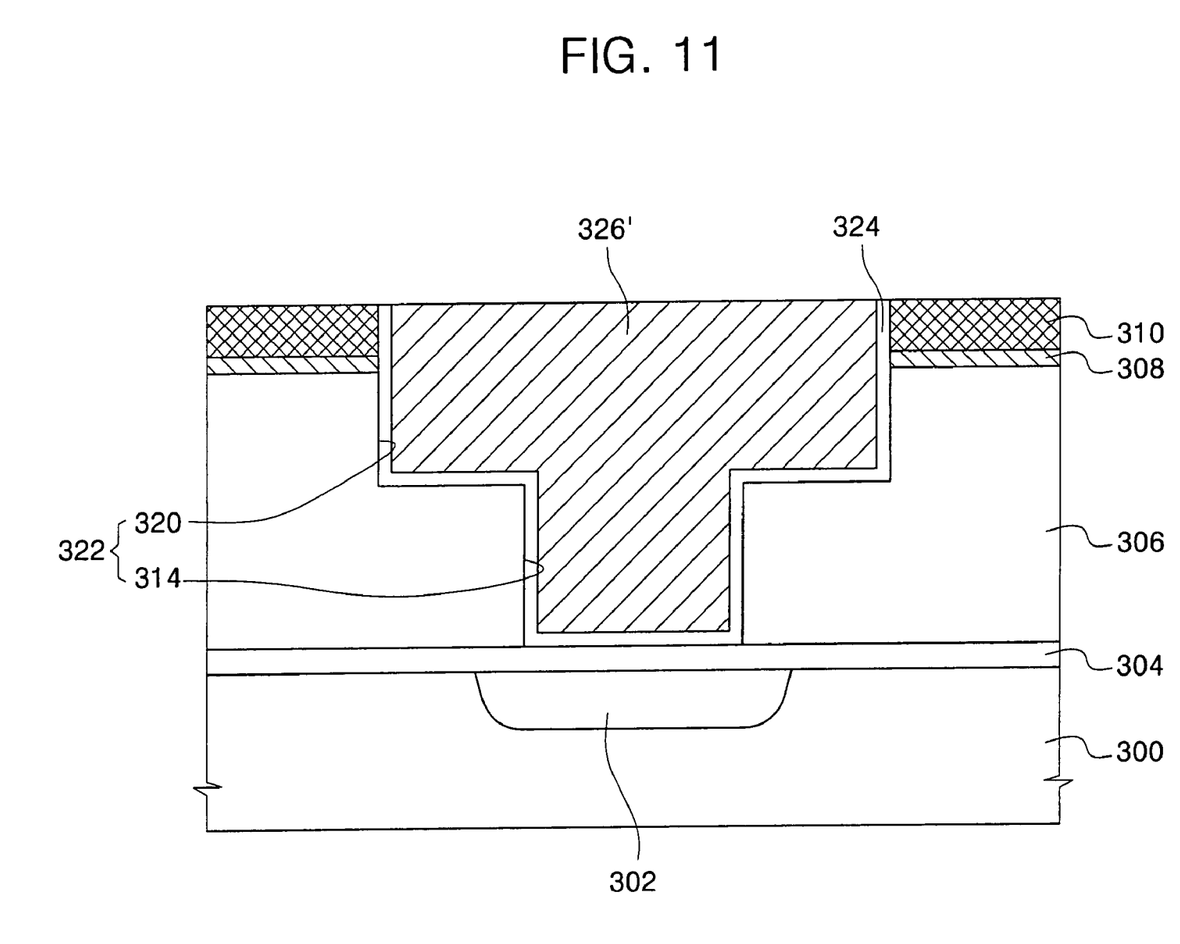

Referring to FIG. 11, conductive layer 326 is planarized to form a conductive layer pattern 326'. For example, conductive layer 326 is preferably chemically and mechanically polished to expose oxide capping layer 310 to form conductive layer pattern 326'. If it was formed, diffusion barrier layer 324 is also removed. Oxide capping layer 310 prevents interlayer insulating layer 306 from being exposed during the polishing. In other words, oxide capping layer 310 prevents slurry contamination or physical damage during the polishing process of interlayer insulating layer 306.

Conductive layer 326, oxide capping layer 310, and oxidation barrier layer 308 may be optionally subjected to the chemical and mechanical polishing to expose interlayer insulating layer 306. As a result, parasitic capacitance due to oxide capping layer 310 and oxidation barrier layer 308 may be prevented.

Hereinafter, an interconnection line structure of the semiconductor device will be described with reference to FIG. 11 in accordance with the second embodiment of the present invention.

The interconnection line structure for the second embodiment of the present invention comprises a semiconductor substrate 300, and an interlayer insulating layer 306 disposed on semiconductor substrate 300. Interlayer insulating layer 306 is formed of a low-k carbon-doped dielectric layer. Etch-stop layer 304 is preferably interposed between semiconductor substrate 300 and interlayer insulating layer 306. An oxidation barrier layer 308 is disposed on interlayer insulating layer 306. Oxidation barrier layer 308 is preferably formed of SiCN. Furthermore, oxidation barrier layer 308 is about 100 Å or less, and more preferably have a thickness of about 50 Å or less. Oxidation barrier layer 308 prevents the upper portion of interlayer insulating layer 306 from being oxidized. In addition, an oxide capping layer 310 is preferably further disposed on oxidation barrier 308 in accordance with the second embodiment. A conductive layer pattern 326' is disposed to fill a dual damascene pattern 322, which passes through oxide capping layer 310, oxidation barrier layer 308, and interlayer insulating layer 306. Dual damascene pattern 322 includes a trench 320 and a via hole 314, which are successively disposed in upper and lower portions of interlayer insulating layer 322 respectively. Dual damascene pattern 322 exposes a conduction region 302. And, if necessary, a diffusion barrier layer 324 may be further interposed between conductive layer pattern 326' and an inner wall of dual damascene pattern 322.

Figure 12:
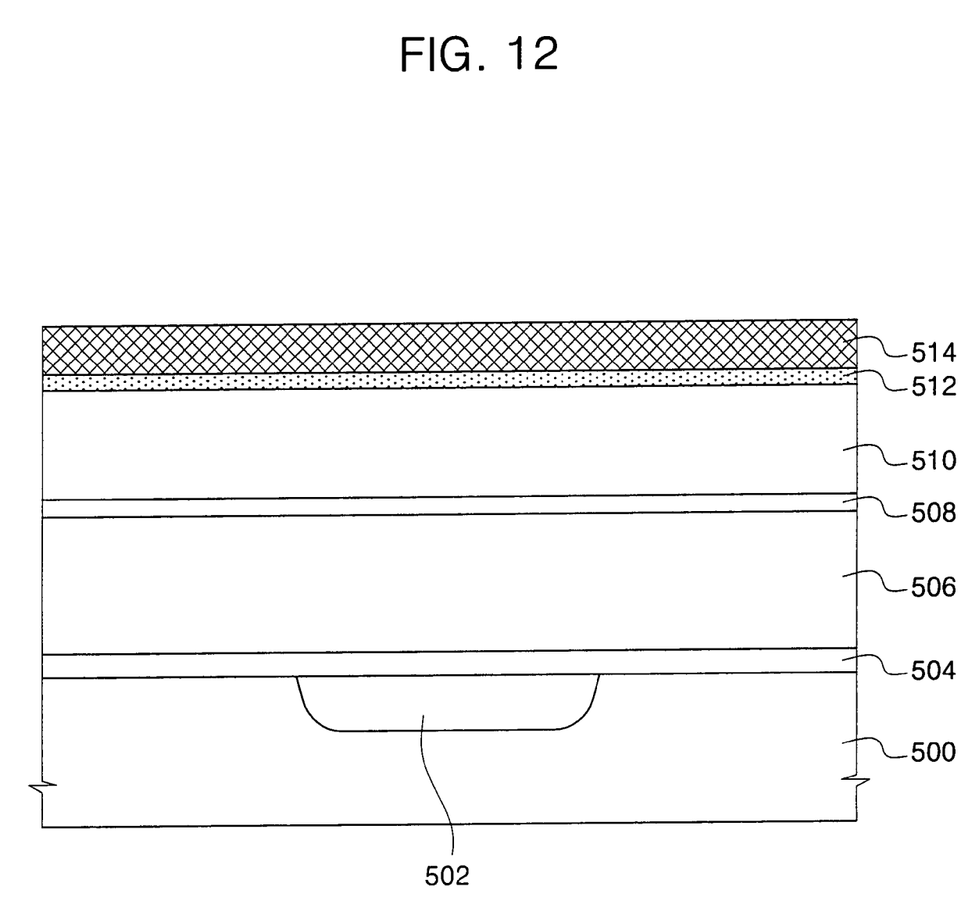
FIG. 12 and FIG. 13 are cross-sectional view illustrating a method for forming an interconnection line of a semiconductor device in accordance with a third embodiment of the present invention.
Figure 13:
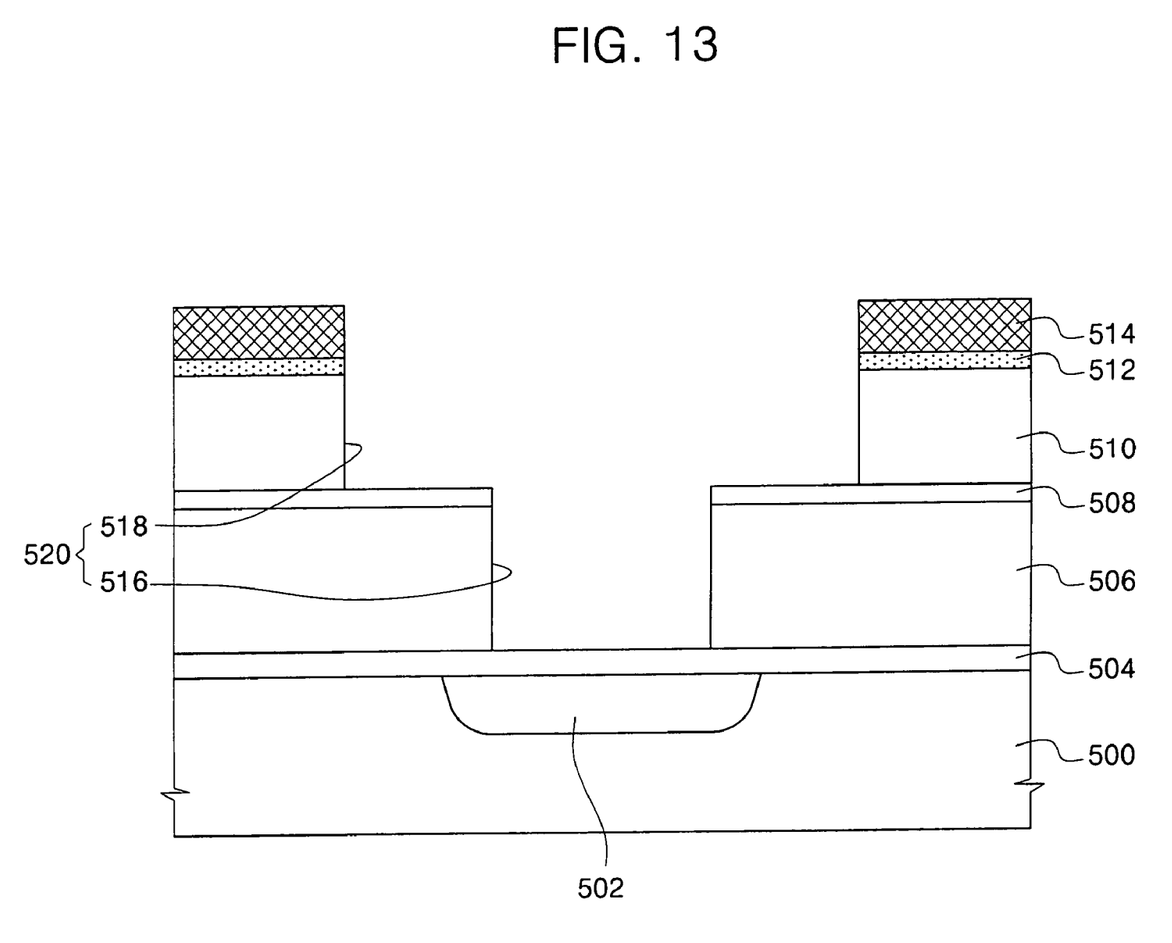

FIG. 12 and FIG. 13 are cross-sectional views illustrating a method for forming an interconnection line of a semiconductor device in accordance with a third embodiment of the present invention.

Referring to FIG. 12, a lower etch-stop layer 504, a first interlayer insulating layer 506, an upper etch-stop layer 508, and a second interlayer insulating layer 510 are successively formed on a semiconductor substrate 500 having a conductive region 502. Each of lower etch-stop layer 504 and upper etch-stop layer 508 is preferably SiN, SiC, or SiCN. First interlayer insulating layer 506 is preferably formed of low-k carbon-doped dielectric material as discussed in the first and second embodiments, but may be formed of a material that has a dielectric constant higher than that of the low-k carbon-doped dielectric material. In other words, first interlayer insulating layer 506 may be formed of a silicon oxide layer, a phosphor silicate glass (PSG) layer, a USG layer, an FSG layer, high density plasma (HDP) layer, a TEOS layer, or a spin-on glass (SOG) layer, which are formed by a CVD method. Second interlayer insulating layer 510 is formed of the low-k carbon-doped dielectric material described in the first and second embodiments of the present invention. The same methods and materials are then applied as in the first embodiment of the present invention to form an oxidation barrier layer 512 and an oxide capping layer 514 on second interlayer insulating layer 510.

Referring to FIG. 13, a dual damascene pattern 520 is formed in oxide capping layer 514, oxidation barrier layer 512 formed of SICN, second interlayer insulating layer 510, upper etch-stop layer 508, and first interlayer insulating layer 506 to expose lower etch-stop layer 504 on conductive region 502.

A brief description will be made on the difference between the second and third embodiments. First, oxide capping layer 514, oxidation barrier layer 512, second interlayer insulating layer 510, upper etch-stop layer 508, and first interlayer insulating layer 506 are successively patterned to form a via hole to expose lower etch-stop layer 504 on conductive region 502. If necessary, a process of forming a sacrificial filling layer as described in the second embodiment may be optionally formed. Oxide capping layer 514, oxidation barrier layer 512, and second interlayer insulating layer 510 are then patterned until upper etch-stop layer 508 is exposed to form a trench 518 within second interlayer insulating layer 510, which overlaps at least with via hole 516. Subsequent processes steps are the same as the second embodiment of the present invention. Alternatively, during the process to remove lower etch-stop layer 504, upper etch-stop layer 508 may be also removed together.

Figure 14A:
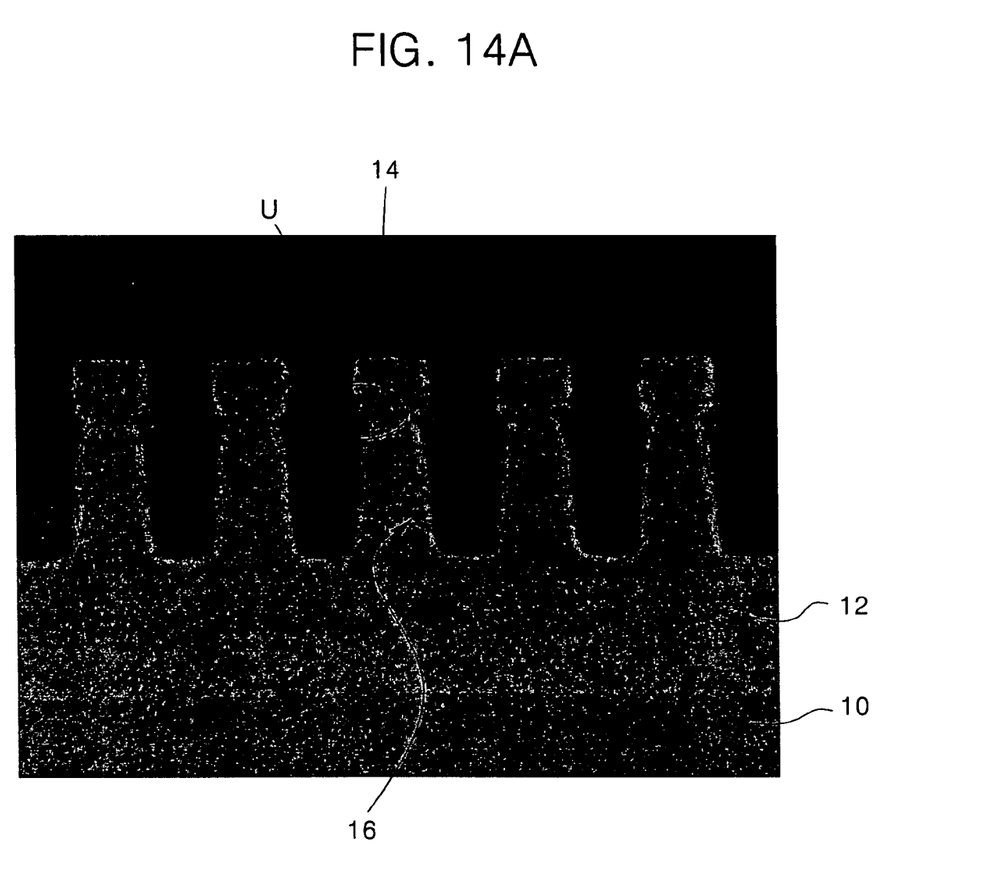
FIG. 14A and FIG. 14B are scanning electron microscope images to compare a conventional method for forming an interconnection line of a semiconductor device with the method for forming an interconnection line of a semiconductor device in accordance with one embodiment of the present invention.
Figure 14B:
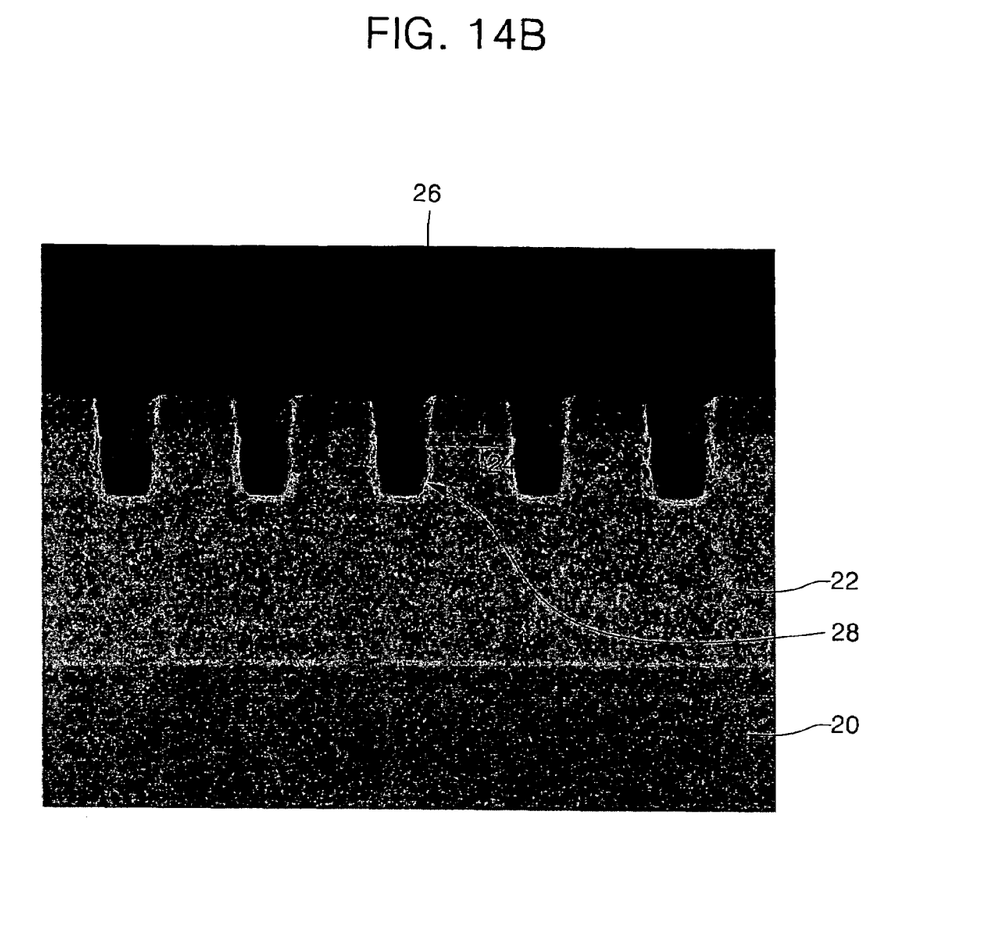

FIG. 14A and FIG. 14B are scanning electron microscope images to compare the conventional method for forming an interconnection line of a semiconductor device with the method for forming an interconnection line of a semiconductor device in accordance with one embodiment of the present invention.

Referring to FIG. 14A, an OSG layer 12, and a USG layer 14 as a capping layer are successively formed on a semiconductor substrate 10. USG layer 14 and OSG layer 12 are successively patterned to form a trench 16 within OSG layer 12. A wet cleaning process is carried out for 90 seconds using an LAL solution (mixed solution of HF and $NH_4Cl$). As a result, it can be seen that undercut "U" occurs at OSG layer 12 in the upper portion of trench 16 as shown in FIG. 14A.

Referring to FIG. 14B, an OSG layer 22, an oxidation barrier layer 24 formed of SiCN, and a USG layer 26 as a capping layer are successively formed on a semiconductor substrate 20. SiCN oxidation barrier layer 24 is formed to a thickness of 70 Å by means of a PECVD method. In this comparative example, a process chamber temperature was between 300° C. to 400° C., and the pressure was 1 Torr to 10 Torr. Trimethyl silane, and $NH_3$ and He used as a reaction gas are injected into the process chamber. USG layer 26, SiCN oxidation barrier layer 24, and OSG layer 22 are successively patterned to form a trench 28 within OSG layer 22. A wet cleaning process is carried out for 90 seconds using LAL solution. As shown in FIG. 14B, the occurrence of the undercut "U" is suppressed.

As described above, an oxidation barrier layer is formed on low-k carbon-doped dielectric material, and an oxide capping layer is formed on the oxidation barrier layer in accordance with the present invention. As a result, an upper portion of the low-k carbon-doped dielectric layer is prevented from being oxidized. Furthermore, the oxidation of the low-k carbon-doped dielectric layer is prevented to thereby suppress the undercut on the upper portion of the low-k carbon-doped dielectric layer during a subsequent wet cleaning process.

In addition, when an interconnection line of the semiconductor device is formed, properties of the low-k carbon-doped dielectric layer are not changed, so as to enhance the reliability of the semiconductor device.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the scope of the present invention.

What is claimed is:

1. A method of forming an interconnection line for a semiconductor device, comprising:
    forming an interlayer insulating layer on a semiconductor substrate, the interlayer insulating layer formed of SiOC or SiOCH;
    forming an SiCN layer on the interlayer insulating layer;
    forming an oxide capping layer on the SiCN layer;
    forming a first photoresist pattern on the oxide capping layer;
    anisotropically etching the oxide capping layer, the SiCN layer, and the interlayer insulating layer using the first photoresist pattern as a first etch mask to form a via hole;
    removing the first photoresist pattern;
    forming a sacrificial filling layer to fill the via hole;
    forming a second photoresist pattern on the sacrificial filling layer;
    anisotropically etching the sacrificial filling layer, the oxide capping layer, the SiCN layer, and a portion of the interlayer insulating layer using the second photoresist pattern as a second etch mask to form a trench overlapping at least a portion of the via hole;
    removing the second photoresist pattern;
    removing the sacrificial filling layer to form a dual damascene pattern on the semiconductor substrate; and
    forming a conductive layer pattern within the dual damascene pattern.

2. The method of claim 1, wherein forming the conductive layer pattern comprises:
    filling the dual damascene pattern with a conductive material; and
    polishing the conductive material using the oxide capping layer as a polishing stop.

3. The method as recited in claim 1, wherein the SiCN layer is formed to a thickness of less than about 100 Å.

4. The method as recited in claim 1, further comprising:
    forming an etch-stop layer on the semiconductor substrate prior to the formation of the interlayer insulating layer.

5. The method as recited in claim 1, further comprising:
    forming a diffusion barrier layer on the oxide capping layer and side-walls of the dual damascene pattern.

6. The method as recited in claim 1, wherein the interlayer insulating layer is a stacked insulating layer comprising an etch-stop layer formed on the first interlayer insulating layer and a second interlayer insulating layer formed on the etch-stop layer.

* * * * *